(12) United States Patent
Saxena

(10) Patent No.: US 6,392,253 B1
(45) Date of Patent: May 21, 2002

(54) SEMICONDUCTOR DEVICE WITH SINGLE CRYSTAL FILMS GROWN ON ARRAYED NUCLEATION SITES ON AMORPHOUS AND/OR NON-SINGLE CRYSTAL SURFACES

(76) Inventor: Arjun J. Saxena, 4217 Pomona Ave., Palo Alto, CA (US) 94306

( * ) Notice: Subject to any disclaimer, the term of this patent is extended or adjusted under 35 U.S.C. 154(b) by 0 days.

(21) Appl. No.: 09/370,100

(22) Filed: Aug. 6, 1999

Related U.S. Application Data
(60) Provisional application No. 60/095,990, filed on Aug. 10, 1998.

(51) Int. Cl.$^7$ .............................................. H01L 29/00
(52) U.S. Cl. ............................ 257/59; 257/50; 257/51; 257/63; 257/64; 257/65; 257/66; 257/347; 257/736; 257/750
(58) Field of Search ............................ 257/50, 59, 51, 257/63–66, 750, 736, 347

Primary Examiner—Fetsum Abraham
(74) Attorney, Agent, or Firm—Fliesler, Dubb, Meyer & Lovejoy LLP; Gideon Gimlan

(57) ABSTRACT

A monolithically integrated, multi-layer device is fabricated with single crystal films of desired orientation grown from arrayed nucleation sites on amorphous and/or non-single crystal surfaces. Examples of devices which can be produced are CMOS and bipolar devices in single crystal (100) and (111) Si films on amorphous surfaces such as SiO2 or Si3N4 in processed ULSIC wafers. These devices can be integrated along the 3rd dimension. Thus, 3-dimensional IC's can be fabricated. Similarly, high performance CMOS devices in SiGe films, MESFET, HEMT and optical devices in compound semiconductor films, can be fabricated within processed ULSIC wafers. Further, Si—, GaAs—, and other compound semiconductor-based devices in the respective single crystal films with different orientations deposited selectively in a given level, and in multilevel IC's, can be manufactured. Solar cells of high efficiency, large area flat panel displays, TV, single crystal films of high Tc superconductors, metals and insulators can be fabricated for a variety of microelectronic and other applications, such as for remote communications with outside systems without requiring metal wiring between the systems.

27 Claims, 8 Drawing Sheets

SEMICONDUCTOR DEVICE WITH SINGLE CRYSTAL FILMS GROWN ON ARRAYED NUCLEATION SITES ON AMORPHOUS AND/OR NON-SINGLE CRYSTAL SURFACES

This application continues from Provisional Application Ser. No. 60/095,990, filed Aug. 10, 1998, now abandoned. The disclosure of said Provisional Application is incorporated herein by reference. Cross reference is hereby made to the commonly owned and co-pending non-provisional application which was also filed on Aug. 10, 1998 by Arjun N. Saxena and assigned Ser. No. 09/131,764, and originally entitled 'Methods For And Products Of Growth Of Single-Crystal On Arrayed Nucleation Sites (SCANS) Defined In Nucleation Unfriendly Substrates'. The disclosure of said non-provisional application is incorporated herein by reference.

BACKGROUND OF THE INVENTION

In the current integrated circuits (ICs) business, whose total world market now is in excess of $100 billion, all of the ICs are manufactured using a 2-dimensional (2-D) technology. This means that all the IC chips on a single crystal (SC) silicon (Si) wafer use various types of devices, such as transistors and diodes, laid out on the Si surface in a 2-D manner. In such a manufacturing technology, epitaxial layers of Si grown on the SC Si wafer substrate are used commonly. These are SC Si layers having the same crystal orientation as that of bulk SC Si wafer. The crystal structure of the epitaxial layers, as well as that of the bulk Si wafer, is required to be near perfect for achieving excellent and reproducible device characteristics. This goal has been achieved, and that is why the entire microelectronic industry has continued to grow according to Moore's Law (Ref. 1), and is doing quite well indeed.

Moore's Law (Ref. 1; ibid) has guided the entire microelectronic industry very well so far. However, the entire microelectronic industry consists of, and Moore's Law applies to, monolithic Si ICs only, in which all the devices are laid out in a 2-dimensional manner in a SC of Si. Such ICs are known popularly as chips, and they can also be referred to as 2D-Si-ICs. Another key point to remember is that these ICs use primarily electrical signals to perform all the functions. For faster electrical functions, eg, in the microwave regime, and for performing optical functions, devices made on SC compound semiconductor wafers and films are needed. Moore's Law (Ref. 1; ibid) does not apply to compound semiconductor ICs, nor to the combination of monolithic Si-compound semiconductor ICs.

One of the key features of Moore's Law (Ref. 1; ibid) is that it predicts the rate of growth of the total number of devices per chip. This requires, and it also forecasts, the rate of decrease of minimum geometries of the devices and interconnects. Consequently these Si ICs, have grown continually in complexity. They have had an ever increasing device density, and they have been fabricated with ever decreasing sizes of the device and interconnect geometries. However, due to the fundamental limits of the materials and the associated technologies, this cannot go on forever. Dr. Moore (Ref. 1; ibid) has reviewed various other factors also, and has concluded that his law will cease to be valid before too long. While no definite limit has been established yet, it appears that the validity of Moore's Law will cease at dimensions smaller than about 0.1 $\mu$m.

The level of integration in Si ICs in terms of device density, however, can continue to be increased beyond the limit of Moore's Law (Ref. 1; ibid), ie, beyond the 2-D limit of 0.1 $\mu$m. This can be achieved even without scaling the device and interconnect geometries, by invoking device fabrication in the third dimension, viz, by manufacturing 3-dimensional (3-D) ICs. This would enhance the device density, and hence the functionality and performance of the Si ICs, both in the present regime where Moore's Law is valid, and also beyond its limit of validity for the 2D-Si-ICs. Thus, the mandatory necessity for continued device and interconnect scaling to achieve an ever increasing number of devices per chip with time according to Moore's Law (Ref. 1; ibid), and to keep on pushing the manufacturing technologies to the limit, is obviated by the 3D-Si-ICs. However, to manufacture the truly 3-dimensional ICs, viz, 3D-Si-ICs, SC films of Si need to be grown on the amorphous (AM) silicon-di-oxide ($SiO_2$) layers or films (these two words, viz, layers or films, are being used interchangeably in this patent write-up, and also in the literature). No production worthy technology is available yet to do this. The $SiO_2$ films, as it is well-known, are an inherent part of the structure of the 2D-Si-ICs.

The requirement to grow good SC films of Si on AM $SiO_2$ films, is similar to that of the bulk SC Si wafers. Their crystal perfection has to be free of any defects, so that the performance characteristics of the devices are excellent and reproducible all the time. Recrystallization of AM and polycrystalline Si (poly-Si) films deposited on AM $SiO_2$ films, has been attempted in the past, but it has not produced good SC films of Si. This technique has given Si films, having small regions with different crystal orientations, and resulting in many grain boundaries. This type of film will produce devices with poor and varying electrical characteristics within a chip, chip-to-chip, and wafer-to-wafer. No wonder that such a film has not yet been successful in producing the 3D-Si-ICs. This is evident from the fact that no such products are available so far in the microelectronic industry. So, the critical need to produce 3D-Si-ICs is to be able to fabricate devices on good SC films of Si grown reproducibly on AM $SiO_2$, or other suitable insulator, eg, $Si_3N_4$, films used currently in the manufacturing of the 2D-Si-ICs.

One of the techniques attempted so far to grow SC films of Si on AM $SiO_2$ films, has been to use epitaxial lateral overgrowth (ELO) technology. In this technology, seeding from the SC Si substrate is used to grow the epitaxial SC Si layers over $SiO_2$ films (Ref. 2). However, this technology, though tried for over a decade, has not yet been successful either to grow good SC films of Si on $SiO_2$ films reproducibly. Another drawback of the ELO technology is that it requires area on the chip for seeding purposes. This negates the advantage of 3D-Si-ICs over 2D-Si-ICs for increasing the device density, by taking away the valuable area for seeding which could have been used for devices. Other approaches to accomplish this, are wafer bonding and SIMOX (separation by implantation of oxygen). For a recent review, see Ref. 3. While these technologies have made good progress for SOI (silicon-on-insulator), they have not yet been found suitable for fabricating 3D-Si-ICs.

The invention described here relates to the fabrication of semiconductor devices in single crystal films grown on arrayed nucleation sites on amorphous and/or non-crystal surfaces. Henceforth, such new devices shall be referred to as SCANS devices. As an example, this invention will allow fabrication of SCANS devices in SC Si films grown selectively on AM $SiO_2$ films of a processed ULSIC wafer. These SC Si films can have any desired orientation of crystal planes, eg, (100), (111), etc. Further, this invention allows fabrication of different types of SCANS devices in SC Si films having different crystallographic planes/structures, grown simultaneously by in-situ selective growth in their respective regions of AM substrates.

Devices for performing optical functions, and for faster electrical functions, eg, in the microwave regime, are better performed with devices fabricated in SC compound semiconductors (eg, GaAs, GaAlAs, GaP, etc) than those fabricated in SC Si. Therefore, it is also of interest to grow SC compound semiconductor films on $SiO_2$ surfaces of ULSICs. The SCANS devices fabricated in such compound semiconductor films, can be used for performing optical functions, and for faster electrical functions, eg, in the microwave regime. The invention described here enables this technology also. Combining the best of both the worlds of Si and compound semiconductor ICs leads to ultra performance ICs (UPICs) (Ref. 4). Thus, the maximum functionality, reliability and low power of Si ICs can be integrated monolithically with the unique performance (eg, optical and microwave) capabilities of the compound semiconductor ICs to produce UPICs. The UPICs are the ultimate in ICs known to mankind (Ref. 4; ibid).

No production worthy technologies to grow SC films of Si and compound semiconductors on AM surfaces are available so far. However, the invention described here enables these technologies for the fabrication of 3D-Si-ICs and UPICs. The invention described here can also be used to enhance the performance and the yield of the current 2D-Si-ICs which are already in manufacturing. The poly-Si films used now in the Si-gate technology, can be replaced with SC Si films grown with this invention on arrayed nucleation sites on AM $SiO_2$ or $Si_3N_4$ films. The process control and the properties of such SC Si films will be superior to those with poly-Si films. As an example, the electrical sheet resistivity of doped poly-Si films of about 15 Ω/square can be reduced to about 5 Ω/square by using SC Si films grown with this invention. This electrical sheet resistivity can be reduced further by the well-known (self-aligned silicide) technology. Further the reliability of the devices with such SC Si films, will be superior to that with poly-Si films. This is due to the improved Si—$SiO_2$ interface with the SC Si films, as compared to that with poly-Si films.

SUMMARY OF THE INVENTION

The purpose of the present invention is to allow the fabrication of devices with an innovative technology, which enables the growth and deposition of SC layers of any desired orientation of almost any material (semiconductor, metal or insulator) on an array of nucleation sites on AM and/or non-single crystal surface. More importantly, this technology will produce SC Si layers of any desired orientation on an AM layer, eg, $SiO_2$ or $Si_3N_4$. More specifically, it will allow growth of SC Si films of (100) crystal orientation on $SiO_2$, which is the most desirable orientation for the manufacturing of complementary metal-oxide-semiconductor (CMOS) ICs. The CMOS ICs are the largest and the most important segment of the entire IC industry. Thus, as an example, the growth of SC Si films with (100) orientation on $SiO_2$ or $Si_3N_4$ films on processed 2D-Si-IC wafers, will enable the fabrication of CMOS 3D-Si-ICs. The need to continue scaling the minimum geometries in the conventional 2D-Si-ICs according to Moore's Law (Ref. 1; ibid), can be stemmed by the 3D-Si-ICs. Moreover, the device densities can continue to be increased with the 3D-Si-ICs even beyond the validity of Moore's Law (Ref. 1; ibid), without pushing the limits of photolithography technology.

The present invention also enables the growth of SC compound semiconductor (eg, GaAs, GaAlAs, GaP, etc) films on $SiO_2$ or $Si_3N_4$ on processed Si wafers. Thus, the optical functions can be performed monolithically with the electrical functions of the ULSIC chips, producing newer chips which have not yet been possible so far in the microelectronic industry. Also, MMICs (Monolithic Microwave ICs) can be fabricated monolithically on Si ULSICs. These technologies will allow system-on-a-chip type of microprocessor chips to be manufactured, which will be superior telecommunication and computer ICs than any kind available today.

The key feature of the present invention is to create arrayed nucleation sites in the AM layers, eg, $SiO_2$ on an IC wafer, by high-dose implantation through a SC mask having appropriate channeling directions at the desired lattice constants. Wherever these nucleation sites are created, they act as affinity sites for the incoming atoms to deposit on them only. These sites encourage to rebuild the crystal matrix at the right places, and they discourage the nucleation at the wrong places on the surface of the AM substrate. Thus, SC layers will be deposited selectively in the regions having the arrayed nucleation sites. On those regions of the AM substrate, where these nucleation sites are not created, the incoming atoms will either not deposit at all, or they will deposit to give a non-single crystal layer. By adjusting the deposition process conditions, the deposition of the non-single crystal layers in the latter regions can be eliminated altogether, while retaining the SC deposition in the previous regions having the arrayed nucleation sites. This is known as the selective deposition process. It is practiced commonly in the industry, eg, for the selective deposition of Si.

The SC mask referred to above, and described in Ref. 6, is a thin membrane, a few microns thick, of a suitable single crystal material. It can be positioned on the desired regions by using, as an example, the step-and-repeat technology similar to a stepper used in photolithography for IC manufacturing. The desired implantations may be performed in apparatus of the Applicant's inventions (Refs. 5 & 6).

Another key feature of this invention is, that the arrayed nucleation sites can be created in the AM layers, eg, $SiO_2$ on an IC wafer, by either "additive" or "subtractive" methods. The "additive" method is defined to be the method when the nucleation sites are created on or near the AM surface by "adding" the desired species. This is accomplished by depositing the desired species, by a channeling type of ion implantation through the SC mask, to give the arrayed nucleation sites on or near the AM surface. Such arrayed nucleation sites correspond to the chosen crystal structure of the SC mask. FIG. 1 shows the distribution of the implanted species, and their differentiated density in the X-direction (lateral, spaced apart across the surface), and Z-direction (depth, from the surface into the bulk) of the AM substrate. The distribution of the implanted species is Gaussian in both directions. The depth of the peak distribution in the Z-direction is termed as the projected range, and is denoted by $r_p$. Its value depends on various factors, eg, the energy and the type of incoming ion, the substrate, and the angle of the implantation. As an example, the $r_p$ of $Si^{28}$ ions of 20–25 KeV energy in AM $SiO_2$ substrate at normal incidence, is about 220–270 A°. The peak of the Gaussian at $r_p$ can be exposed by appropriate etching procedures, eg, by reactive ion etching (RIE).

The "subtractive" method relies on knocking off an atom from the host AM substrate from each of the arrayed affinity sites defined by the SC mask, by a suitable process, such as sputter etching or chemical removal. This is illustrated for an AM $SiO_2$ substrate in FIG. 2. FIG. 2(a) shows two "$SiO_4$" tetrahedra of AM $SiO_2$ linked together. The first tetrathedron has $Si_1$ at the center, linked with four oxygen atoms labelled as $O_{11}$, $O_{12}$, $O_{13}$ and $O_{14}$. Similarly, the second tetrahedron has $Si_2$ at the center, linked with four oxygen atoms labelled as $O_{21}$, $O_{22}$, $O_{23}$ and $O_{24}$. The oxygen atom linking the two tetrahedra is shared between them, and it is labelled as $O_{14}/O_{22}$. When, as an example, an argon (Ar) ion is implanted through the SC mask, it can knock off the oxygen atom from one of the tetrahedra of the AM $SiO_2$ substrate. This is shown in FIG. 2(b), in which $O_{11}$ is removed, leaving one of the chemical bonds of $Si_1$ open. This acts as a nucleation site for the incoming Si during the subsequent epitaxial growth. As an example, $Ar^{40}$ ions of 20–25 KeV energy can be used to create the affinity sites by the "subtractive" method employing sputter etching. For these $Ar^{40}$ ions, the $r_p$ in AM $SiO_2$ substrate at normal incidence, is about 180–240 A°. Similarly, $F^{19}$ can be used with $H_2$ flowing at the surface of the AM $SiO_2$ substrate, to create the affinity sites by the "subtractive" method employing chemical etching.

An example for growing SCAN films of Si having the (100) crystal structure is as follows. A thin SC mask of (100) Si, 7–12 μm thick, can be used through which Si ions can be implanted in the channeling direction to create the nucleation sites on a $SiO_2$ layer of a Si IC wafer. The energy of implanting ions is preferably low, and the dose is preferably high. Typical energy is about 20 to 25 KeV, and the Si implantation dose can be about $10^{14}$ to $10^{16}/cm^2$. Such a SC mask may be cooled to liquid nitrogen temperature to retard, if not prevent, its amorphization at certain high dosages of the implant. Subsequent to this creation of nucleation sites, epitaxial Si is grown on such a $SiO_2$ surface by CVD of Si. The chemicals used for this epitaxial growth can be $SiCl_4$, $SiHCl_3$, $SiH_2Cl_2$ or $SiH_4$ in $H_2$ carrier gas in a conventional epi reactor, or, once again, the Applicant's invention (Ref. 5; ibid) can be used. Similarly, the arrayed nucleation sites for other materials can be used by using an appropriate mask for the desired single crystal orientation, and implanting and depositing the desired nucleation species through such a mask. Subsequent to this, epitaxial growth for the desired SC can be employed.

The present invention also enables large area semiconductor films to be grown on AM glass substrates. They can be used for producing large area solar cells of high efficiency. This will enable electric power to be generated from sunlight economically. Such solar cells will become more and more important to mankind with the passage of time, as the natural fossil fuels are depleted in the world. Another important feature of the present invention is that it will allow the fabrication of large area flat panel displays and TV, which will be superior to those currently known.

The unique capability of the present invention is to enable the selective growth of SC films of almost any material, having the desired crystal structure, on suitable AM substrates. Thus, it can also be utilized to grow SC layers of high $T_c$ superconductors on AM substrates. This capability will allow high critical currents to be achieved in high $T_c$ superconductors, which is an important limitation in today's technology. Therefore, such high $T_c$ superconductor films can be also used for the interconnect applications in high efficiency large area solar cells, flat panel displays, TVs, Si-ICs, and UPICs.

| Nos. | Description |
| --- | --- |
| 1. | Bulk single crystal Si (N or P-type). |
| 2. | P-well. |
| 3. | N-well. |
| 4. | NMOS (self-aligned gate with sidewall spacers). |
| 5. | Isolation (eg, LOCOS). |
| 6. | PMOS (self-aligned gate with sidewall spacers). |
| 7. | ILD-0 (Inter Layer Dielectric; pre-metal-1). |
| 8. | Planarized contacts to Si & gates (latter not shown). |
| 9. | M-1 (1st level metal interconnect). |
| 10. | ILD-1 (Inter Layer Dielectric; post-metal-1). |
| 11. | Planarized contacts to M-1. |
| 12. | M-2 (2nd level metal interconnect). |
| 13. | ILD-2 (Inter Layer Dielectric; post-metal-2). |
| 14. | Planarized contacts to M-2. |
| 15. | M-3 (3rd level metal interconnect). |
| 16. | ILD-3 (Inter Layer Dielectric; post-metal-3). |
| 17. | Planarized contacts to M-3. |
| 18. | M-4 (4th level metal interconnect). |
| 19. | Passivation dielectric. |

Figure 3:
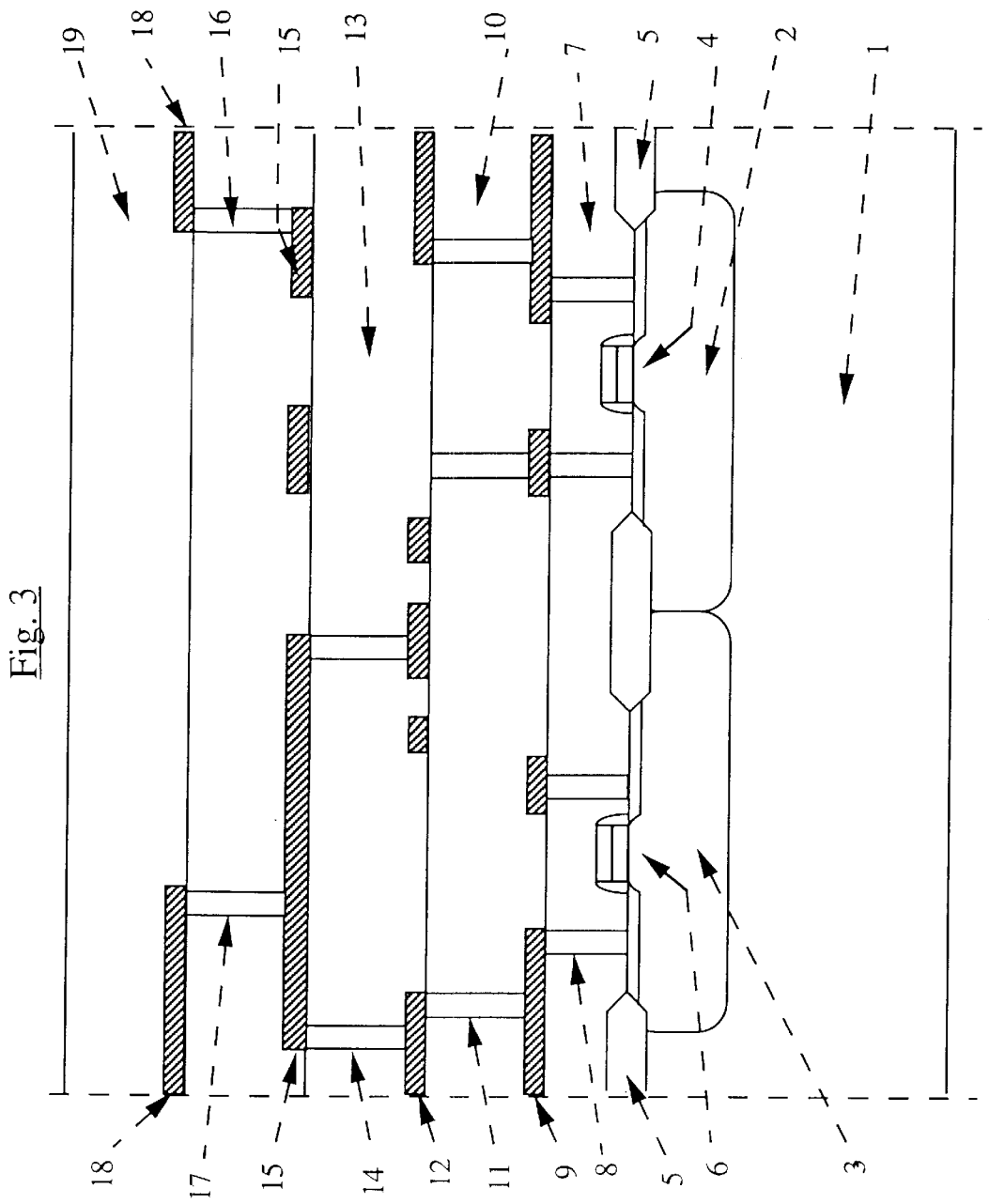
FIG. 3 is a cross section (not drawn to scale) of a conventional 2D-CMOS on bulk single crystal Si with 4-level interconnects. The legends shown as numbers 1 through 19, identify the various devices, materials and films. They are not shown again in FIGS. 4, 5, 6 and 7 (described subsequently) to avoid cluttering of numbering. However, all the devices, materials and films denoted by 1 through 19 in FIG. 3 are the same in FIGS. 4–7. The detailed definitions of the various SCANS devices are given later in the section on "DETAILED DESCRIPTION OF THE PREFERRED EMBODIMENT". For convenience in referring to all the devices, materials and films denoted by 1 through 19, and identifying them in the discussions, they are explained as follows.
Figure 4:
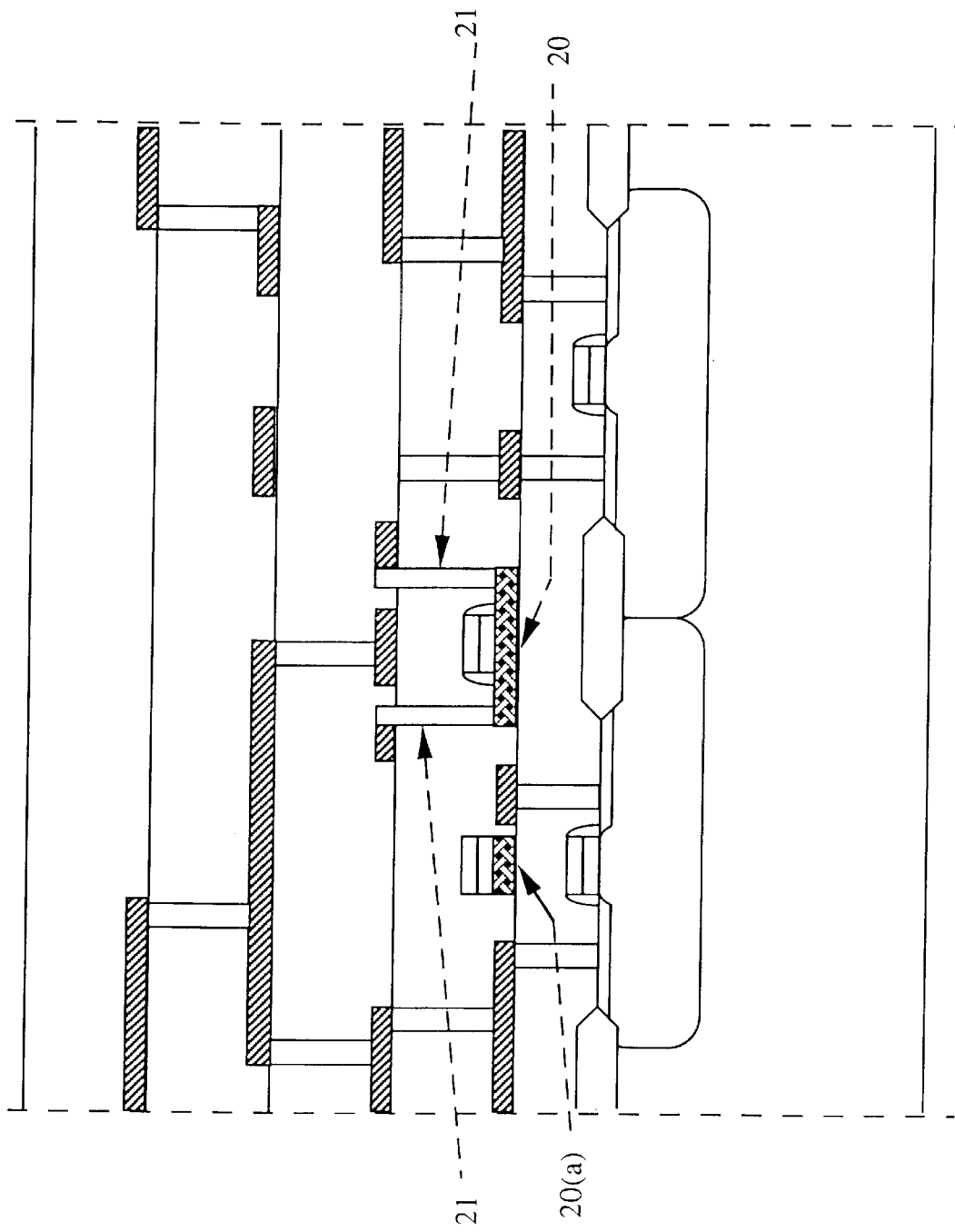

FIG. 4 is a cross section (not drawn to scale) of a 3D-CMOS/UPIC with 1-level SCANS-1 devices and 4-level interconnects. The legends in addition to those given in FIG. 3 are given below.

| Nos. | Description |
| --- | --- |
| 20. | SCANS-1 device (Single Crystal on Arrayed Nucleation Sites-1 grown on ILD-0; devices can be of any type needed, eg, NMOS, PMOS, bipolar transistors, etc). |
| 20(a). | This is also a SCANS-1 device similar to that denoted by no. 20, but its layout is shown stacked to the device in the bulk single crystal below, and its cross section is normal to that of no. 20. |
| 21. | Planarized contacts to SCANS-1 device labelled by no. 20. Contacts to SCANS-1 device labelled by no. 20 (a) are not shown. |

Figure 5:
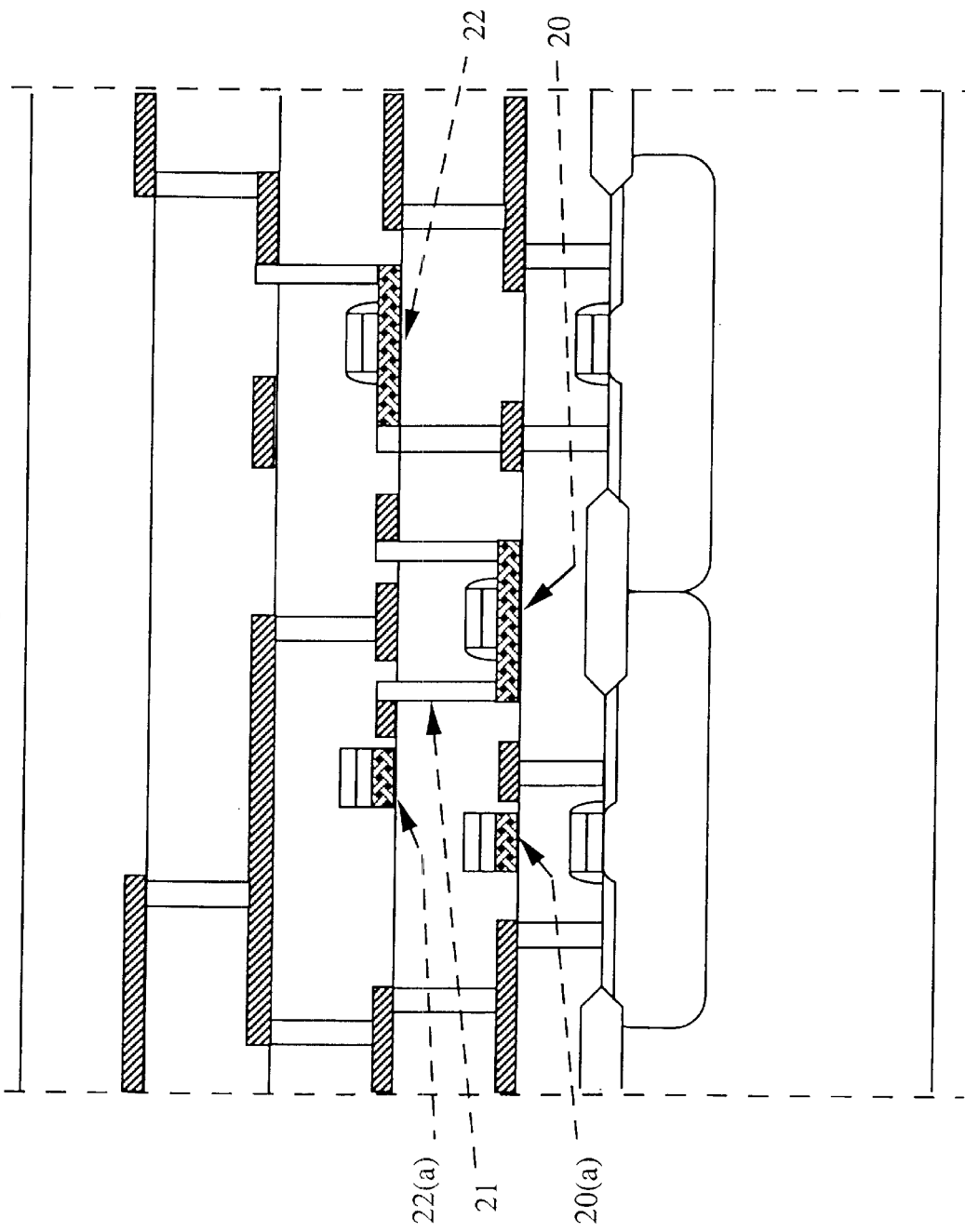

FIG. 5 is a cross section (not drawn to scale) of a 3D-CMOS/UPIC with 2-level SCANS-1 and SCANS-2 devices and 4-level interconnects. The legends in addition to those given in FIG. 3 are given below.

| | |
|---|---|
| 20, | (same as in FIG. 4) |
| 20(a), | |
| 21. | (same as in FIG. 4) |
| 22. | SCANS-2 device (Single Crystal on Arrayed Nucleation Sites-2 grown on ILD-1; devices can be of any type needed, eg, NMOS, PMOS, bipolar transistors, etc). |
| 22(a). | This is also a SCANS-2 device similar to that denoted by no. 22, but its layout is shown stacked to the SCANS-1 device 20(a) below, and its cross section is normal to that of no. 22. |
| 23. | Planarized contacts to SCANS-2 device labelled by no. 22. Contacts to SCANS-2 device labelled by no. 22 (a) are not shown. |

Figure 6:
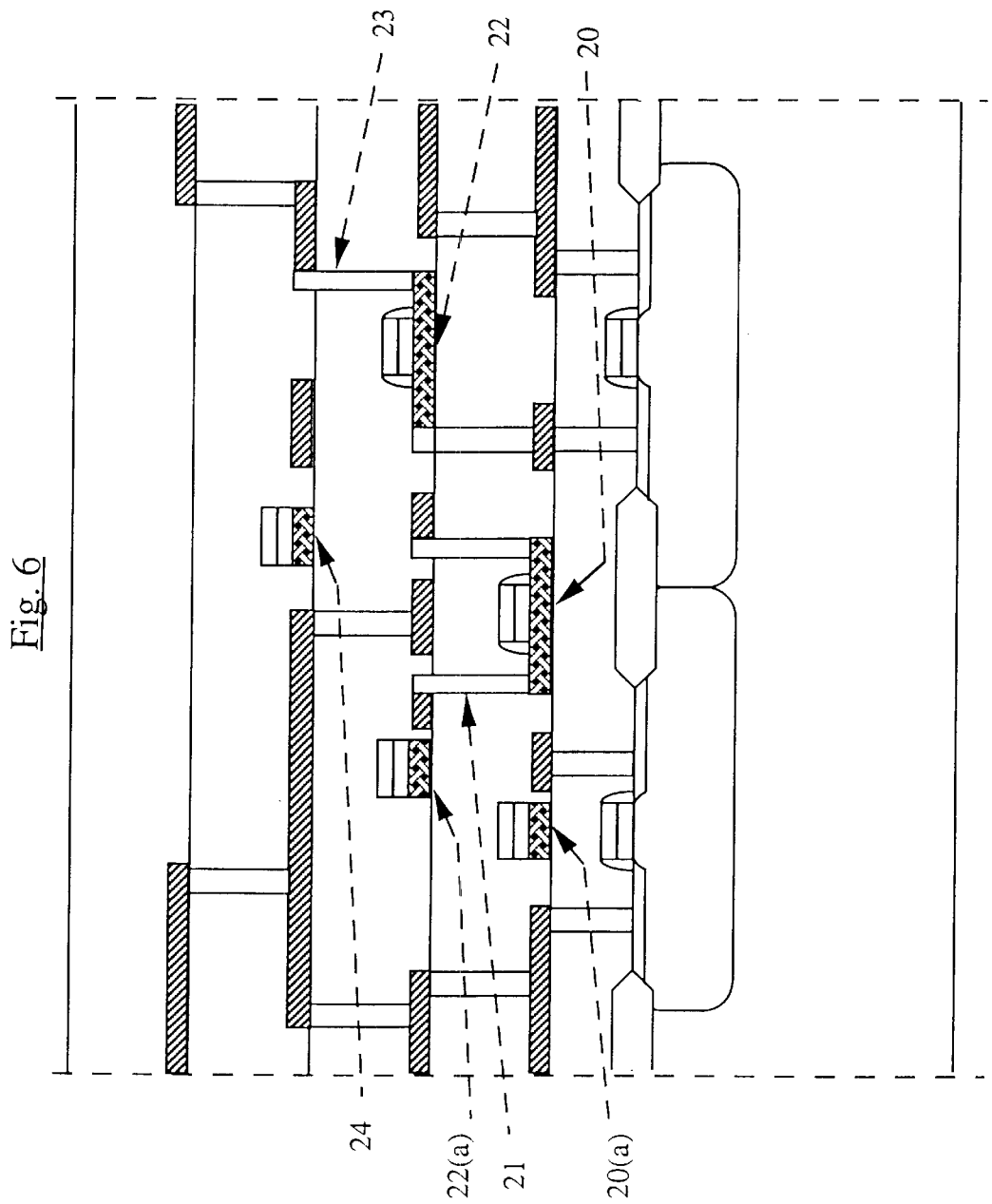

FIG. 6 is a cross section (not drawn to scale) of a 3D-CMOS/UPIC with 3-level SCANS-1, SCANS-2 and SCANS-3 devices and 4-level interconnects. The legends in addition to those given in FIG. 3 are given below.

| | |
|---|---|
| 20, | (same as in FIGS. 4 & 5) |
| 20(a), | |
| 21, | (same as in FIGS. 4 & 5) |
| 22, | |
| 22(a). | |
| 23. | (same as in FIGS. 4 & 5) |
| 24. | SCANS-3 device (Single Crystal on Arrayed Nucleation Sites-3 grown on ILD-2; devices can be of any type needed, eg, NMOS, PMOS, bipolar transistors, etc). Its cross section is shown as normal to that of nos. 20 & 22. Contacts to this SCANS-3 device labelled by no. 24 are not shown. |

Figure 7:
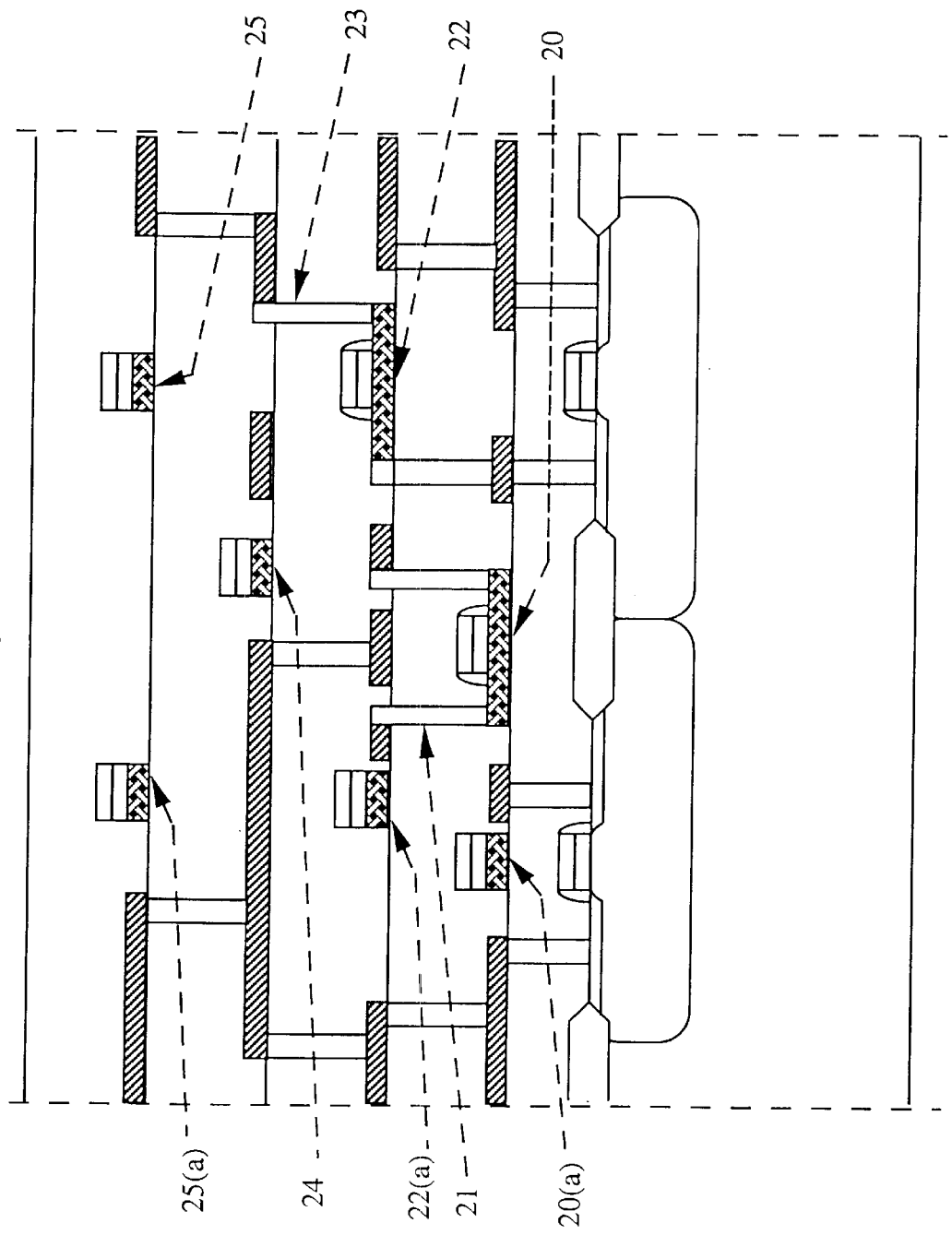

FIG. 7 is a cross section (not drawn to scale) of a 3D-CMOS/UPIC with 4-level SCANS-1, SCANS-2, SCANS-3 and SCANS-4 devices and 4-level interconnects. The legends in addition to those already shown in FIGS. 3–6, are given below.

| | |
|---|---|
| 25. | SCANS-4 device (Single Crystal on Arrayed Nucleation Sites-4 grown on ILD-3; devices can be of any type needed, eg, NMOS, PMOS, bipolar transistors, etc). Its cross section is shown as normal to that of nos. 20 & 22. Contacts to this SCANS-4 device labelled by no. 25 are not shown. Although any SCANS device can be fabricated in single crystal Si films, or compound semiconductor films of choice (eg, GaAs), these SCANS-4 devices in particular could be the electro-optical devices (light sources and/or detectors), to communicate with outside systems via optical signals, and without requiring metal interconnencts between these systems. |

DETAILED DESCRIPTION OF THE PREFERRED EMBODIMENT

In order to understand the key steps of the invention, and their process integration to produce the new 3D-Si-ICs and UPICs, first a typical twin-tub-CMOS process flow for a conventional 2D-Si-IC on bulk single crystal Si with 4-level interconnects is given below. FIG. 3 shows a cross section (not drawn to scale) of such a structure. The details of various process steps, eg, lithography, RIE, LPCVD, sputtering, dielectric and metal planarizations, etc, are not given, as they are well known to those conversant in the state of the art. Only the process flow is given in terms of process block nos. for the fabrication of conventional 2D-CMOS on bulk single crystal Si with 4-level interconnects. The sequence of the various process blocks is given in the order usually followed in manufacturing, and is self-explanatory.

Minor modifications can be made to the sequence and the process blocks, to suit one's manufacturing process. Legend nos. identifying the various films and devices in FIG. 3, have been written within square brackets, viz, [. . . ], for the appropriate process block nos. This is to correlate the films and devices with the processes, and make it easier to follow the process flow.

In the subsequent sections, the key changes to the process flow are indicated at the appropriate process steps, which are needed for fabricating the different types of 3D-ICs and UPICs. FIGS. 4–7 shall be used which show their cross sections. Numbers 1 through 19 used in FIG. 3 to identify various devices, materials and films, are not repeated in FIGS. 4, 5, 6 and 7 to avoid cluttering of numbering. However, all the devices, materials and films denoted by 1 through 19 in FIG. 3 are the same in FIGS. 4–7.

1. Process Flow for a Twin-tub-CMOS 2D-Si-IC on Bulk Single Crystal Si with 4-Level Interconnects

| Process block nos. | Description |
|---|---|
| 1. | Start material; bulk single crystal Si (N or P-type). [Legend #1] |
| 2. | P-well formation. [Legend #2] |
| 3. | N-well formation. [Legend #3] |
| 4. | Isolation (eg, LOCOS). [Legend #5] |
| 5. | NMOS (self-aligned salicided gate with sidewall spacers) fabrication. [Legend #4] |
| 6. | PMOS (self-aligned salicided gate with sidewall spacers) fabrication. [Legend #6] |
| 7. | ILD-0 (Inter Layer Dielectric; pre-metal-1) deposition. [Legend #7] |
| 8. | Dielectric (ILD-0) planarization. |
| 9. | Planarized contacts to salicided Si & gates (latter not shown). [Legend #8] |
| 10. | Contact metal planarization (when needed). |
| 11 | M-1 (1st level metal interconnect) formation/planarization. [Legend #9] |
| 12. | ILD-1 (Inter Layer Dielectric; post-metal-1) deposition. [Legend #10] |
| 13. | Dielectric (ILD-1) planarization. |
| 14. | Planarized contacts to M-1 (and to salicided gates & Si not shown). [Legend #11] |
| 15. | M-2 (2nd level metal interconnect) formation/planarization. [Legend #12] |
| 16. | ILD-2 (Inter Layer Dielectric; post-metal-2) deposition. [Legend #13] |
| 17. | Dielectric (ILD-2) planarization. |
| 18. | Planarized contacts to M-2 (and to M-1, salicided gates & Si not shown). [Legend #14] |
| 19. | M-3 (3rd level metal interconnect) formation/planarization. [Legend #15] |
| 20. | ILD-3 (Inter Layer Dielectric; post-metal-3) deposition. [Legend #16] |
| 21. | Dielectric (ILD-3) planarization. |
| 22. | Planarized contacts to M-3 (and to M-2, M-1, salicided gates & Si not shown). [Legend #17] |
| 23. | M-4 (4th level metal interconnect) formation/planarization. [Legend #18] |
| 24. | Passivation dielectric deposition. [Legend #19] |
| 25. | Pad mask. |

2. The Key Feature and the Technology of the Invention

The key feature of the invention is the fabrication of semiconductor devices in single crystal films grown on arrayed nucleation sites on AM and/or non-crystal surfaces. These new devices, as explained before, are referred to as the SCANS devices. Further refinement of the terminology, viz, SCANS-1, SCANS-2, SCANS-3, SCANS-4, etc, is to delineate the level of the AM films in an IC, on which the SCANS devices are fabricated. SCANS-1 devices are those fabricated on SC films grown on pre-metal-1 dielectric film, designated as ILD-0 (ie, Inter Layer Dielectric no. 0, which is deposited before metal-1 is deposited). SCANS-2 devices are those fabricated on SC films grown on pre-metal-2 dielectric film, designated as ILD-1 (ie, Inter Layer Dielectric no. 1, which is deposited before metal-2 is deposited). SCANS-3 devices are those fabricated on SC films grown on pre-metal-3 dielectric film, designated as ILD-2 (ie, Inter Layer Dielectric no. 2, which is deposited before metal-3 is deposited). SCANS-4 devices are those fabricated on SC films grown on pre-metal-4 dielectric film, designated as ILD-3 (ie, Inter Layer Dielectric no. 3, which is deposited before metal-4 is deposited). Similarly, subsequent higher level SCANS devices, eg, SCANS-5, SCANS-6, etc, can be defined.

The key technology of the invention lies in fabricating the necessary devices (eg, CMOS and bipolar transistors, diodes, etc) on the SC films grown on insulating substrates. These SC films needed for the SCANS devices, can be grown selectively on, or over the entire surface of, AM and/or non-single crystal films/substrates. Such substrates include AM $SiO_2$ films of a processed ULSIC wafer. This is achieved due to the arrayed nucleation sites created in the AM film, eg, $SiO_2$ of a Si IC wafer, by high-dose implantation of the chosen species through a mask having appropriate channeling directions at the desired lattice constants of the SC film to be grown. These implantations may be performed in an ion implanter having an aligned mask described in a recent patent of the Applicant (Ref. 6). Subsequent to this creation of nucleation sites, epitaxial film of the desired material, eg, Si, is grown on such a $SiO_2$ surface by the CVD of Si. Similarly, nucleation sites for other materials can be created by using an appropriate mask for the chosen single crystal orientation, and implanting the desired nucleation species through such a mask. Subsequent to this, epitaxial growth for the desired SC film can be done, on which the SCANS devices of the present invention can be fabricated. An example for fabricating Si SCANS devices on the $SiO_2$ surface of the Si IC wafer, is given below.

The creation of the nucleation sites for the SC films needed for the SCANS devices is done as follows. Place the $SiO_2$ surface of the Si IC wafer under the mask of the apparatus described in Ref. 6. Align the mask such that the ion beam, used for implanting and creating the nucleation sites, is parallel to the channeling direction of the mask. Implant Si with a low energy (eg, 20 to 25 KeV) and high dose (>$10^{14}$ to $10^{16}/cm^2$) through the mask. The choice of the ion, energy and the dose can be tailored for a specific SC film. This includes deposition of the specific ions, and/or partial removal of the host material (eg, oxygen or Si from $SiO_2$), in a 2-dimensional (2-D) X-Y array defined by the mask. Therefore, the nucleation sites are created in the 2-D array on the $SiO_2$ surface, on which the SC Si film is deposited subsequently. The mask can be much smaller than the Si IC wafer. Either the wafer, or the mask, can be translated or stepped across in the X-Y direction to cover the entire area of the wafer wherever needed. The active area of the mask can consist of the patterns of one, or more than one, IC, similar to that practiced in the reticle technology used with steppers. Similarly, a mask can consist of multiple sub-masks having different channeling directions, which can be stepped across the substrate. Thus, the nucleation sites for different crystal structures, eg, (100) and (111) can be created simultaneously. The nucleation sites created by implantation, have dangling bonds which bind with the incoming Si atoms deposited by the epitaxial growth process described in the next step. Since these nucleation sites are in a 2-D X-Y array, spaced apart corresponding to the desired crystal structure, eg, (100), the incoming Si atoms in the epitaxial growth process nucleate preferably on these sites, and not on the other regions of the $SiO_2$ surface which do not have the nucleation sites. This forms the key basis for the selective growth of the (100) SC Si film on the $SiO_2$ surface, only on the regions which have the nucleation sites. Similarly, nucleation sites for other atoms can be created by choosing the right species of atoms and a mask appropriate for the desired crystal structure.

The epitaxial growth of the SC films needed for the SCANS devices is done as follows. For SCANS-1 devices, a conventional Si CVD epitaxy process can be used to grow the single crystal layers of Si on the substrate having the nucleation sites created in the previous step. Alternately, the Applicant's invention (Ref. 7) for an improved process to deposit the SC layer of Si can be used. The limitation of the maximum temperature required for the epitaxy process for SCANS-1 devices, is rather minimal. This is so, because this process is done before metal-1 is deposited. The usual thicknesses of the epitaxial Si films for device/IC fabrication range between 0.05–0.5 $\mu$m. With the applicant's invention (Ref. 7—ibid), Si epitaxy can be achieved at a temperature 700–850° C., which is lower than 1000–1100° C. required with the conventional CVD process. The advantage of this is, that the dopant profiles in the devices are kept more or less intact because of the lower temperatures used in the Applicant's invention (Ref. 7—ibid).

The epitaxial growth of the SC films needed for the SCANS-2, SCANS-3, SCANS-4, and subsequent SCAN devices, requires some caution. The maximum temperature, $T_{max}$, required for the epitaxial growth of the SC films for these devices, depends on the details of the multilevel metallizations used to interconnect the various devices. As an example for the widely used Al-based interconnects with $SiO_2$-based ILDs, $T_{max}$ should not exceed about 450° C. preferably, after the first deposition of Al-based interconnects. For the SCANS device levels, up to which only refractory metals and their silicides are used with still $SiO_2$-based ILDs, $T_{max}$ can exceed the limit of 450° C. However, it depends on the metallurgy used for metallizations. As an example, the $T_{max}$ for W and $WSi_2$ can be about 700–850° C., but appropriate precautions with the barrier metals are implied. When polymer-based ILDs are used, for example for low κ (dielectric constant) applications, the $T_{max}$ is usually limited to about 250–350° C. In such cases, when the $T_{max}$ is required to be substantially less than 850° C., then molecular beam expitaxy (MBE) can be used in lieu of the CVD epitaxy to grow the single crystal films on the arrayed nucleation sites.

The fabrication of the SCANS devices is essentially similar to that on bulk SC Si wafers. This is so because the films on which the SCANS devices are fabricated are also SC Si, in the above example. Appropriate adjustment of some of the processes, eg, ion implantation, thermal time-temperature cycles, multilevel metallizations, may be needed depending on the SCANS device type, similar to those needed for SOI. For a review, see books by J. P. Colinge (Ref. 8) and S. Cristoloveanu (Ref. 9).

The above process steps can give not only SCANS devices with SC Si films grown on processed Si IC wafers, but they can also be used to fabricate SCANS devices on processed compound semiconductor, eg, GaAs, wafers. Many variations of this invention can be made without departing from its key concept of growing SC films on AM or non-crystalline substrates, and fabricating SCANS devices. This can be achieved by changing materials, channeling masks, and substrates, for a combination suitable for the desired SC films needed for the SCANS devices.

The creation of the array of nucleation sites, and the deposition of SC films for the SCANS devices, can also be done in the defined regions of the AM ILDs/substrates which have been recessed down to a certain depth. The depth of the recessed regions formed in the AM ILDs, is equal to the thickness of the SC films to be grown in these regions. These recessed regions are formed by the well known masking and etching techniques. The 2-D X-Y array of nucleation sites are created in these recessed regions, similar to those described earlier (viz, by implantation through the aligned mask, and appropriate stepping and scanning across these recessed regions). Thus, the SC films needed for the SCANS devices can be grown only in the recessed regions, such that the surfaces of these films are coplanar with those of the ILDs. This aspect of the invention will simplify, if not eliminate, the planarization processes.

3. Process Flow for 3D-CMOS/UPIC with 1-level SCANS-1 Devices and 4-Level Interconnects A typical process flow for 3D-CMOS/UPIC with 1-level SCANS-1 devices and 4-level interconnects is described in this section. As defined earlier, SCANS-1 devices are those fabricated on SC films grown on pre-metal-1 dielectric film, designated as ILD-0 (ie, Inter Layer Dielectric no. 0, which is deposited before metal-1 is deposited). FIG. 4 shows a cross section of a 3D-CMOS/UPIC with 1-level SCANS-1 devices and 4-level interconnects. For convenience, the process flow given previously for the conventional 2D-CMOS is copied below. The additional steps needed for fabricating a 3D-CMOS/UPIC, are inserted in between the process block nos. of the process flow. For further simplicity, these additional steps are given for a 3D-Si-CMOS only, ie, a 3D-Si-IC with bulk Si 2D-CMOS, and 1-level Si SCANS-1 film/devices. For a UPIC with bulk Si 2D-CMOS, and 1-level compound semiconductor SCANS-1 film/devices, the additional steps can be adapted to the compound semiconductor of choice. Similarly, the process steps can be easily modified to allow the fabrication of both Si and compound semiconductor SCANS devices at each desired levels.

| Process block nos. | Description |
| --- | --- |
| 1. | Start material; bulk single crystal Si (N or P-type). [Legend #1] |
| 2. | P-well formation. [Legend #2] |
| 3. | N-well formation. [Legend #3] |
| 4. | Isolation (eg, LOCOS). [Legend #5] |
| 5. | NMOS (self-aligned salicided gate with sidewall spacers) fabrication. [Legend #4] |
| 6. | PMOS (self-aligned salicided gate with sidewall spacers) fabrication. [Legend #6] |
| 7. | ILD-0 (Inter Layer Dielectric; pre-metal-1) deposition. [Legend #7] |
| 8. | Dielectric (ILD-0) planarization. |
| 8.1 | Formation of arrayed nucleation sites of desired crystal orientation(s) in appropriate regions of ILD-0 surface. |
| 8.2 | Deposition of single crystal Si (or compound semiconductor) films on these regions having arrayed nucleation sites. This is SCANS-1 Si (or compound semiconductor) film. [Legend #20, 20(a)] |
| 8.3 | NMOS and/or PMOS (self-aligned gate with sidewall spacers) fabrication. These are SCANS-1 devices. |

-continued

| Process block nos. | Description |
| --- | --- |
|  | [Legend #20, 20(a)] |
| 9. | Planarized contacts to salicided Si & gates (latter not shown). [Legend #8] |
| 10. | Contact metal planarization (when needed). |
| 11 | M-1 (1st level metal interconnect) formation/planarization. [Legend #9] |
| 12. | ILD-1 (Inter Layer Dielectric; post-metal-1) deposition. [Legend #10] |
| 13. | Dielectric (ILD-1) planarization. |
| 14. | Planarized contacts to M-1 (and to salicided gates & Si not shown). [Legend #11] |
| 14.1 | Planarized contacts to SCANS-1 devices. [Legend #21] |
| 15. | M-2 (2nd level metal interconnect) formation/planarization. [Legend #12] |
| 16. | ILD-2 (Inter Layer Dielectric; post-metal-2) deposition. [Legend #13] |
| 17. | Dielectric (ILD-2) planarization. |
| 18. | Planarized contacts to M-2 (and to M-1, salicided gates & Si not shown). [Legend #14] |
| 19. | M-3 (3rd level metal interconnect) formation/planarization. [Legend #15] |
| 20. | ILD-3 (Inter Layer Dielectric; post-metal-3) deposition. [Legend #16] |
| 21. | Dielectric (ILD-3) planarization. |
| 22. | Planarized contacts to M-3 (and to M-2, M-1, salicided gates & Si not shown). [Legend #17] |
| 23. | M-4 (4th level metal interconnect) formation/planarization. [Legend #18] |
| 24. | Passivation dielectric deposition. [Legend #19] |
| 25. | Pad mask. |

4. Process Flow for 3D-CMOS/UPIC with 2-Level SCANS-1 and SCANS-2 Devices and 4-Level Interconnects A typical process flow for 3D-CMOS/UPIC with 2-level SCANS-1 and SCANS-2 devices and 4-level interconnects is described in this section. As described before, SCANS-1 devices are those fabricated on SC films grown on pre-metal-1 dielectric film, designated as ILD-0 (ie, Inter Layer Dielectric no. 0, which is deposited before metal-1 is deposited). SCANS-2 devices are those fabricated on SC films grown on pre-metal-2 dielectric film, designated as ILD-1 (ie, Inter Layer Dielectric no. 1, which is deposited before metal-2 is deposited). FIG. 5 shows a cross section of a 3D-CMOS/UPIC with 2-level SCANS-1 and SCANS-2 devices and 4-level interconnects. For convenience, the process flow given previously for the 3D-CMOS/ UPIC with 1-level SCANS-1 devices is copied below. The additional steps needed for fabricating a 3D-CMOS/UPIC with 2-level SCANS-1 and SCANS-2 devices and 4-level interconnects are inserted in between the process block nos. of the process flow. For further simplicity, these additional steps are given for a 3D-Si-CMOS only, ie, a 3D-Si-IC with bulk Si 2D-CMOS, and 2-level Si SCANS-1 and SCANS-2 film/devices. For a UPIC with bulk Si 2D-CMOS, and 2-level compound semiconductor SCANS-1 and SCANS-2 films/devices, the additional steps can be adapted to the compound semiconductor of choice. Similarly, the process steps can be easily modified to allow the fabrication of both Si and compound semiconductor SCANS devices at each desired levels.

| Process block nos. | Description |
|---|---|
| 1. | Start material; bulk single crystal Si (N or P-type). [Legend #1] |
| 2. | P-well formation. [Legend #2] |
| 3. | N-well formation. [Legend #3] |
| 4. | Isolation (eg, LOCOS). [Legend #5] |
| 5. | NMOS (self-aligned salicided gate with sidewall spacers) fabrication. [Legend #4] |
| 6. | PMOS (self-aligned salicided gate with sidewall spacers) fabrication. [Legend #6] |
| 7. | ILD-0 (Inter Layer Dielectric; pre-metal-1) deposition. [Legend #7] |
| 8. | Dielectric (ILD-0) planarization. |
| | 8.1 Formation of arrayed nucleation sites of desired crystal orientation(s) in appropriate regions of ILD-0 surface. |
| | 8.2 Deposition of single crystal Si (or compound semiconductor) films on these regions having arrayed nucleation sites. This is SCANS-1 Si (or compound semiconductor) film. [Legend #20, 20(a)] |
| | 8.3 NMOS and/or PMOS (self-aligned gate with sidewall spacers) fabrication. These are SCANS-1 devices. [Legend #20, 20(a)] |
| 9. | Planarized contacts to salicided Si & gates (latter not shown). [Legend #8] |
| 10. | Contact metal planarization (when needed). |
| 11 | M-1 (1st level metal interconnect) formation/planarization. [Legend #9] |
| 12. | ILD-1 (Inter Layer Dielectric; post-metal-1) deposition. [Legend #10] |
| 13. | Dielectric (ILD-1) planarization. |
| | 13.1 Formation of arrayed nucleation sites of desired crystal orientation(s) in appropriate regions of ILD-1 surface. |
| | 13.2 Deposition of SC Si (or compound semiconductor) films on these regions having arrayed nucleation sites. This is SCANS-2 Si (or compound semiconductor) |
| | 13.3 NMOS and/or PMOS (self-aligned gate with sidewall spacers) fabrication. These are SCANS-2 devices. [Legend #22, 22(a)] [Legend #8] film. [Legend #22, 22(a)] |
| 14. | Planarized contacts to M-1 (and to salicided gates & Si not shown). [Legend #11] |
| | 14.1 Planarized contacts to SCANS-1 devices. [Legend #21] |
| 15. | M-2 (2nd level metal interconnect) formation/planarization. [Legend #12] |
| 16. | ILD-2 (Inter Layer Dielectric; post-metal-2) deposition. [Legend #13] |
| 17. | Dielectric (ILD-2) planarization. |
| 18. | Planarized contacts to M-2 (and to M-1, salicided gates & Si not shown). [Legend #14] |
| | 18.1 Planarized contacts to SCANS-2 devices. [Legend #23] |
| 19. | M-3 (3rd level metal interconnect) formation/planarization. [Legend #15] |
| 20. | ILD-3 (Inter Layer Dielectric; post-metal-3) deposition. [Legend #16] |
| 21. | Dielectric (ILD-3) planarization. |
| 22. | Planarized contacts to M-3 (and to M-2, M-1, salicided gates & Si not shown). [Legend #17] |
| 23. | M-4 (4th level metal interconnect) formation/planarization. [Legend #18] |
| 24. | Passivation dielectric deposition. [Legend #19] |
| 25. | Pad mask. |

5. Process Flows for 3D-CMOS/UPIC with 3-level SCANS-1, SCANS-2 and SCANS-3 Devices and 4-Level Interconnects, and for 3D-CMOS/UPIC with 4-Level SCANS-1, SCANS-2, SCANS-3 and SCANS-4 Devices and 4-Level Interconnects The definitions of the various SCANS-1, SCANS-2, SCANS-3 and SCANS-4 devices have been given before. FIG. 6 shows a cross section of a 3D-CMOS/UPIC with 3-level SCANS-1, SCANS-2 and SCANS-3 devices and 4-level interconnects. FIG. 7 shows a cross section of a 3D-CMOS/UPIC with 4-level SCANS-1, SCANS-2, SCANS-3 and SCANS-4 devices and 4-level interconnects.

The process flow given above for 3D-CMOS/UPIC with 2-level SCANS-2 and SCANS-2 devices and 4-level interconnects, can be easily adapted to give the process flows for 3D-CMOS/UPIC with 3-level SCANS-1, SCANS-2 and SCANS-3 devices and 4-level interconnects, and for 3D-CMOS/UPIC with 4-level SCANS-1, SCANS-2, SCANS-3 and SCANS-4 devices and 4-level interconnects. The details are not given here. Those conversant in the state of the art of ULSIC technology, can easily add the process steps after ILD-2 and ILD-3 planarizations, similar to those after ILD-1 planarization given above for 3D-CMOS/UPIC with 2-level SCANS-1 and SCANS-2 devices and 4-level interconnects.

REFERENCES CITED

U.S. PATENT DOCUMENTS

Ref. 2: M. S. Liu and B. Hoefflinger, "Three-Dimensional CMOS Using Selective Epitaxial Growth", U.S. Pat. No. 4,686,758; Aug. 18, 1987.

Ref. 5: A. N. Saxena, "Apparatus for Selective Chemical Vapor Deposition of Dielectric, Semiconductor and Conductive Films on Semiconductor and Metallic Substrates", U.S. Pat. No. 5,472,508; Dec. 5, 1995.

Ref. 6: A. N. Saxena, "Advanced Technique to Grow Single Crystal Films on Amorphous and/or Non-Single crystal Surfaces", U.S. Pat. No. 5,792,270; Aug. 11, 1998.

Ref. 7: A. N. Saxena, "Method for Selective Chemical Vapor Deposition of Dielectric, Semiconductor and Conductive Films on Semiconductor and Metallic Substrates", U.S. Pat. No. 5,212,118; May 18, 1993.

U.S PUBLISHED DOCUMENTS

Ref. 1: G. E. Moore, "Lithography and the Future of Moore's Law", Optical/Laser Microlithography VIII: Proceedings of the SPIE, 2440, Feb. 20, p. 2–17, 1995.

Ref. 3: M. L. Alles, "Thin-film SOI emerges", IEEE Spectrum, June, p. 37–45, 1997.

Ref. 4: A. N. Saxena, K. Ramkumar, S. K. Ghosh, and M. A. Bourgeois, "Technology and Reliability Issues of Multilevel Interconnects in Bipolar, BICMOS and CMOS VLSIC/ULSIC", Pro. IEEE Bipolar/BiCMOS Circuits and Technology Meeting (BCTM), Minneapolis, Minn., p. 12–19, 1993.

Ref. 8: J. P. Colinge, "Silicon-on-Insulator Technology: Materials to VLSI", Kluwer Academic, 1991.

Ref. 9: S. Cristoloveanu, "Electrical Charcaterization of Silicon-on-Insulator Materials and Devices", Kluwer Academic, 1995.

BRIEF DESCRIPTION OF THE DRAWINGS

CAPTIONS & LEGENDS FOR FIGS. 1, 2, 3, 4, 5, 6 & 7

Figure 1:
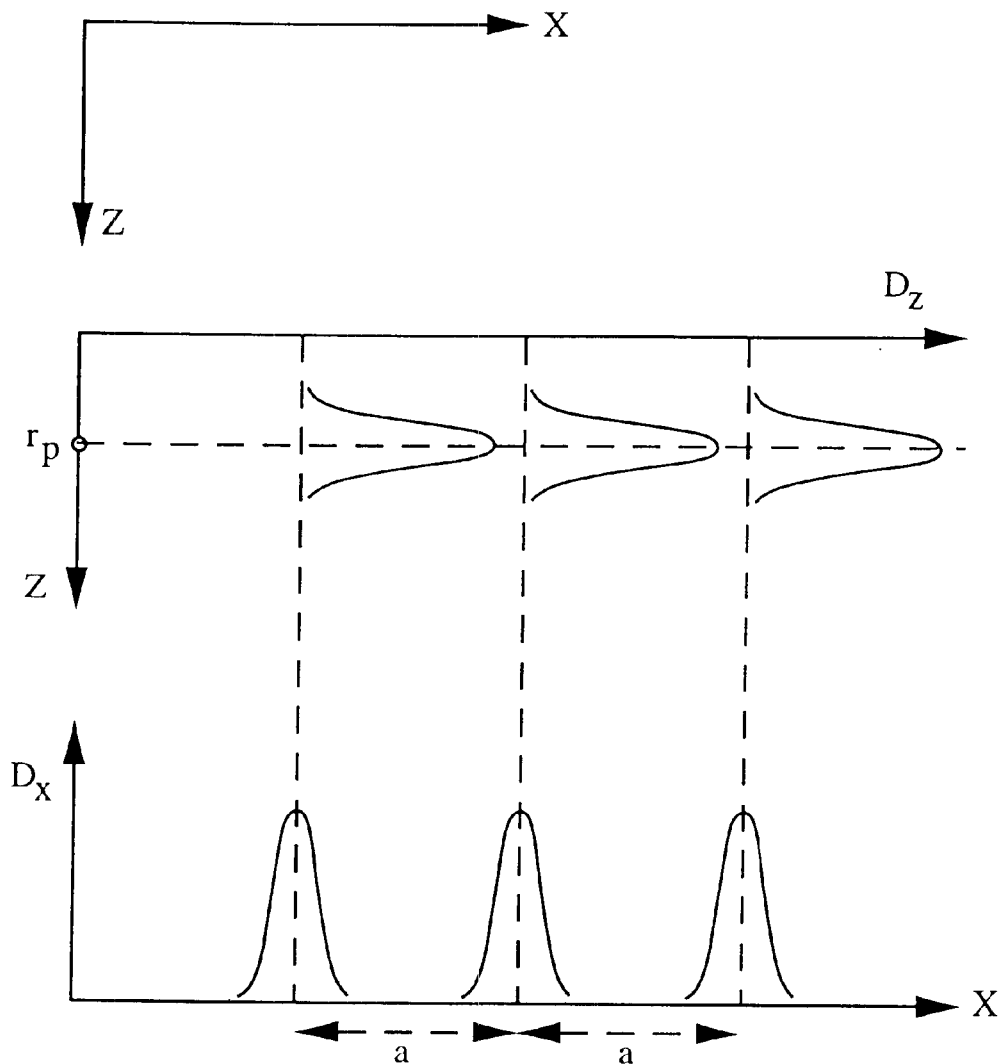
FIG. 1 illustrates the differentiated density of nucleating sites created in an AM substrate. It is shown in the X-direction (lateral, spaced apart across the surface of the substrate), denoted by $D_x$. In the Z-direction (depth, from the surface into the bulk of the substrate), it is denoted by $D_z$.

FIG. 1: It illustrates the differentiated density of nucleating sites created in an AM substrate. It is shown in the X-direction (lateral, spaced apart across the surface of the substrate), denoted by $D_x$. In the Z-direction (depth, from the surface into the bulk of the substrate), it is denoted by $D_z$.

Figure 2:
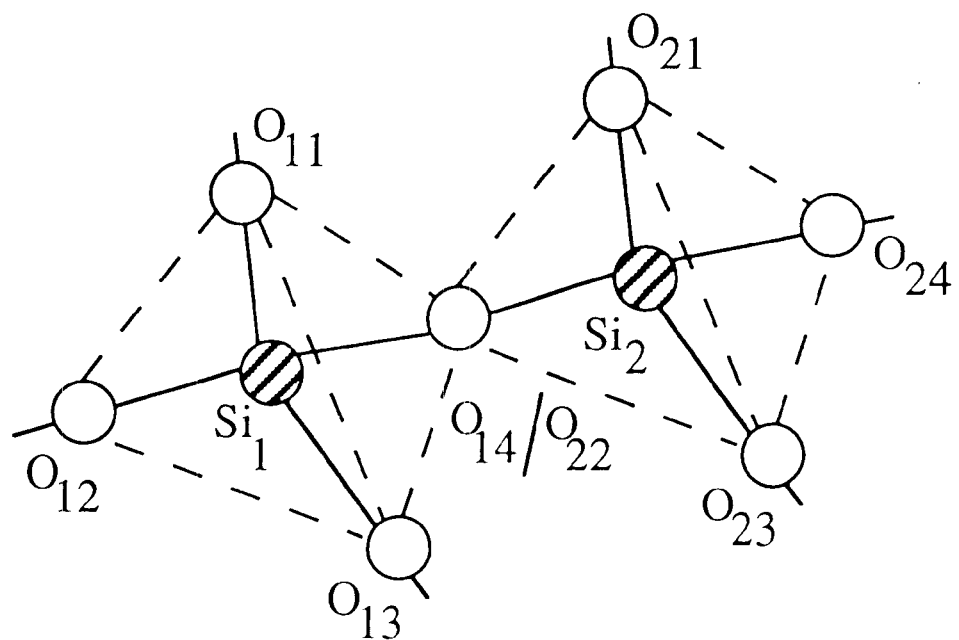
FIG. 2(a) shows two "$SiO_4$" tetrahedra of AM $SiO_2$ linked together. The first tetrahedron has $Si_1$ at the center, linked with four oxygen atoms labelled as $O_{11}$, $O_{12}$, $O_{13}$ and $O_{14}$. Similarly, the second tetrahedron has $Si_2$ at the center, linked with four oxygen atoms labelled as $O_{21}$, $O_{22}$, $O_{23}$ and $O_{24}$. The oxygen atom linking the two tetrahedra is shared between them, and it is labelled as $O_{14}/O_{22}$.
FIG. 2(b) shows that the oxygen atom $O_{11}$ has been removed, eg, by a subtractive process, leaving one of the chemical bonds of $Si_1$ open. This acts as a nucleation site for the incoming Si during the subsequent epitaxial growth.
Figure 2:
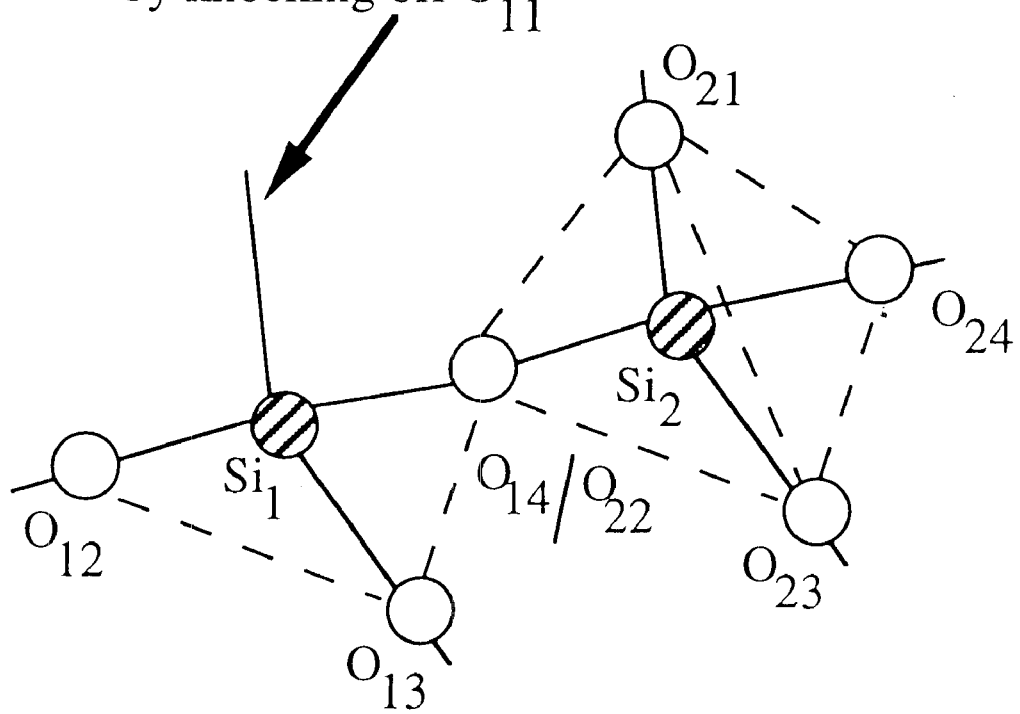

FIG. 2($a$): It shows two "$SiO_4$" tetrahedra of AM $SiO_2$ linked together. The first tetrathedron has $Si_1$ at the center, linked with four oxygen atoms labelled as $O_{11}$, $O_{12}$, $O_{13}$ and $O_{14}$. Similarly, the second tetrathedron has $Si_2$ at the center, linked with four oxygen atoms labelled as $O_{21}$, $O_{22}$, $O_{23}$ and $O_{24}$. The oxygen atom linking the two tetrahedra is shared between them, and it is labelled as $O_{14}/O_{22}$.

FIG. 2(b): It shows that the oxygen atom $O_{11}$ is removed, leaving one of the chemical bonds of $Si_1$ open. This acts as a nucleation site for the incoming Si during the subsequent epitaxial growth.

FIG. 3: Conventional 2D-CMOS on bulk single crystal Si with 4-level interconnects.

(Numbers 1 through 19 used in FIG. 1 to identify various devices, materials and films, are not repeated and shown in FIGS. 4, 5, 6 and 7 to avoid cluttering of numbering. However, all the devices, materials and films denoted by 1 through 19 in FIG. 3 are the same in FIGS. 4–7.)

| Nos. | Description |
|---|---|
| 1. | Bulk single crystal Si (N or P-type). |
| 2. | P-well. |
| 3. | N-well. |
| 4. | NMOS (self-aligned gate with sidewall spacers). |
| 5. | Isolation (eg, LOCOS). |
| 6. | PMOS (self-aligned gate with sidewall spacers). |
| 7. | ILD-0 (Inter Layer Dielectric; pre-metal-1). |
| 8. | Planarized contacts to Si & gates (latter not shown). |
| 9. | M-1 (1st level metal interconnect). |
| 10. | ILD-1 (Inter Layer Dielectric; post-metal-1). |
| 11. | Planarized contacts to M-1. |
| 12. | M-2 (2nd level metal interconnect). |
| 13. | ILD-2 (Inter Layer Dielectric; post-metal-2). |
| 14. | Planarized contacts to M-2. |
| 15. | M-3 (3rd level metal interconnect). |
| 16. | ILD-3 (Inter Layer Dielectric; post-metal-3). |
| 17. | Planarized contacts to M-3. |
| 18. | M-4 (4th level metal interconnect). |
| 19. | Passivation dielectric. |

FIG. 4 : 3D-CMOS/UPIC with 1-level SCANS-1 devices and 4-level interconnects.

| Nos. | Description |
|---|---|
| 20. | SCANS-1 device (Single Crystal on Arrayed Nucleation Sites-1 grown on ILD-0; devices can be of any type needed, eg, NMOS, PMOS, bipolar transistors, etc). |
| 20(a). | This is also a SCANS-1 device similar to that denoted by no. 20, but its layout is shown stacked to the device in the bulk single crystal below, and its cross section is normal to that of no. 20. |
| 21. | Planarized contacts to SCANS-1 device labelled by no. 20. Contacts to SCANS-1 device labelled by no. 20 (a) are not shown. |

FIG. 5 : 3D-CMOSIUPIC with 2-level SCANS-1 and SCANS-2 devices and 4-level interconnects.

| | |
|---|---|
| 20, | (same as in FIG. 4). |
| 20(a) | |
| 21. | (same as in FIG. 4). |
| 22. | SCANS-2 device (Single Crystal on Arrayed Nucleation Sites-2 grown on ILD-1; devices can be of any type needed, eg, NMOS, PMOS, bipolar transistors, etc). |
| 22(a). | This is also a SCANS-2 device similar to that denoted by no. 22, but its layout is shown stacked to the SCANS-1 device 20(a) below, and its cross section is normal to that of no. 22. |
| 23. | Planarized contacts to SCANS-2 device labelled by no. 22. Contacts to SCANS-2 device labelled by no. 22 (a) are not shown. |

FIG. 6 : 3D-CMOSJUPIC with 3-level SCANS-I, SCANS-2 and SCANS-3 devices and 4level interconnects.

| | |
|---|---|
| 20, | (same as in FIGS. 4 & 5). |
| 20(a) | |
| 21, | (same as in FIGS. 4 & 5). |
| 22, | |
| 22(a) | |
| 23 | (same as in FIGS. 4 & 5). |
| 24. | SCANS-3 device (Single Crystal on Arrayed Nucleation Sites-3 grown on ILD-2; devices can be of any type needed, eg, NMOS, PMOS, bipolar transistors, etc). Its cross section is shown as normal to that of nos. 20 & 22. Contacts to this SCANS-3 device labelled by no. 24 are not shown. |

FIG. 7: 3D-CMOS/UPIC with 4-level SCANS-I, SCANS-2, SCANS-3 and SCANS-4 devices and 4-level interconnects.

25. SCANS-4 device (Single Crystal on Arrayed Nucleation Sites-4 grown on ILD-3; devices can be of any type needed, eg, NMOS, PMOS, bipolar transistors, etc). Its cross section is shown as normal to that of nos. 20 & 22. Contacts to this SCANS-4 device labelled by no. 25 are not shown. Although any SCANS device can be fabricated in single crystal Si films, or compound semiconductor films of choice (eg, GaAs), these SCANS-4 devices in particular could be the electro-optical devices (light sources and/or detectors), to communicate with outside systems via optical signals, and without requiring metal interconnects between these systems.

What is claimed is:

1. A monolithic device comprising a plurality of monolithically integrated layers including at least:

(a) a first layer; and (b) a second layer, disposed above the first layer and operatively coupled to the first layer for communicating with the first layer; wherein:

(a.1) said first layer includes a respective first single crystal material grown from a corresponding first set of spaced-apart nucleation-friendly sites whose apart spacings correspond to whole number multiples of respective lattice constants of the first single crystal material, and the spaced-apart nucleation-friendly sites of the first set thereby substantially define a first growth template which seeded growth of said first single crystal material therefrom, where each first nucleation-friendly site in said first set is defined by one or more first particles to which the material of the first single crystal material attaches more preferentially than to first surrounding material surrounding the first nucleation-friendly site, the first surrounding material being nucleation-unfriendly to the material of the first single crystal material;

(b.1) said second layer includes a respective second single crystal material grown from a corresponding second set of spaced-apart nucleation-friendly sites whose apart spacings correspond to whole number multiples of respective lattice constants of the second single crystal material, and the spaced-apart nucleation-friendly sites of the second set thereby substantially define a second growth template which seeded growth of said second single crystal material therefrom, where each second nucleation-friendly site in said second set is defined by one or more second particles to which the material of the second single crystal material attaches more preferentially than to second surrounding material surrounding the second nucleation-friendly site, the second surrounding material being nucleation-unfriendly to the material of the second single crystal material.

2. A multilayer monolithic device as set forth in claimed 1, wherein the said first and second single crystal materials respectively define local interconnects within their respective first and second layers.

3. A multilayer monolithic device as set forth in claim 1, wherein each of the first and second layers has opposed surfaces with one of the surfaces having a respective single crystal material provided thereat and the other of the opposed surfaces having an insulator provided thereat.

4. A multilayer monolithic device as set forth in claim 1, wherein the first and second single crystal materials respectively define respective, but different semiconductor materials.

5. The multilayer monolithic device of claim 4, wherein the different semiconductor materials include two or more selected from the group consisting of:
 (ab.1) silicon having a (100) orientation of crystal planes;
 (ab.2) silicon having a (111) orientation of crystal planes;
 (ab.3) GaAs;
 (ab.4) GaAlAs;
 (ab.5) GaP; and
 (ab.6) SiGe.

6. A device as set forth in claim 1, wherein the first and second single crystal materials each respectively define at least one of single crystal silicon and single crystal compound semiconductor films grown on arrayed nucleation sites, wherein the arrayed nucleation sites are defined in respective ones of amorphous materials.

7. A device as set forth in claim 1, wherein at least one of said first and second single crystal materials is grown from a corresponding set of nucleation-friendly sites exposed on a surface of a $SiO_2$ layer.

8. A device as set forth in claim 1, wherein at least one of said first and second single crystal materials is grown from a corresponding set of nucleation-friendly sites disposed in an amorphous material.

9. A device as set forth in claim 1, wherein at least one of the first and second single crystal materials is grown from a corresponding set of nucleation-friendly, silicon sites disposed in an amorphous material.

10. A device as set forth in claim 1, wherein at least one of the first and second single crystal materials is grown from a corresponding set of nucleation-friendly sites disposed in $Si_3N_4$.

11. A device as set forth in claim 1, wherein at least one of the first and second single crystal materials is grown from a corresponding set of nucleation-friendly sites exposed from a surface of an amorphous material and is structured to have a (100) crystal orientation.

12. A device as set forth in claim 1, wherein at least one of the first and second single crystal materials is grown from a corresponding set of nucleation-friendly sites provided within a recessed region defined in a non-single crystal substrate.

13. A multilayer monolithic device as set forth in claim 1, wherein at least one of the first and second single crystal materials defines a single crystal gate of, and/or a single crystal local interconnect to a field effect transistor of the device.

14. A device as set forth in claim 1, wherein the first and second single crystal materials respectively define a respective first and second member of the group consisting of: CMOS circuitry, BICMOS circuitry, and bipolar circuitry.

15. A multilayer monolithic device as set forth in claim 1, wherein at least one of the first and second single crystal materials defines a single crystal SiGe film having varying concentrations of Ge provided thereacross for defining both CMOS and bipolar devices.

16. A multilayer monolithic device as set forth in claim 1, wherein at least one of the first and second single crystal materials defines a single crystal insulator.

17. The multilayer monolithic device of claim 16, wherein the single crystal insulator defines an inter-layer dielectric (ILD) within the multilayer monolithic device.

18. The multilayer monolithic device of claim 16, wherein the single crystal insulator defines a passivation layer protecting lower layers of the multilayer monolithic device from contamination.

19. A multilayer monolithic device as set forth in claim 1, wherein at least one of the first and second single crystal materials is disposed on an amorphous glass that is used for a flat panel display.

20. A multilayer monolithic device a set forth in claim 1, wherein at least one of the first and second single crystal defines an optical waveguide that is monolithically integrated within said device for suporting optical communications.

21. The multilayer monolithic device of claim 1, wherein said SCANS devices are selected from the group consisting of NMOS transistors, PMOS transistors, bipolar transistors, MESFETs, HEMTs, and electro-optical devices.

22. A multilayer monolithic device a set forth in claim 1, wherein at least one of the first and second single crystal materials defines a single crystal metal connector that serves as an interlayer interconnector between layers of said device.

23. A multilayer monolithic device a set forth in claim 1, wherein the second single crystal material defines optical devices which allow optical communicating with outside systems.

24. The multilayer monolithic device of claim 1, wherein the said first and second single crystal materials respectively define transistor gates within their respective first and second layers.

25. The multilayer monolithic device of claim 1, wherein the said first and second single crystal materials respectively define SCANS devices (devices fabricated in Single Crystal films grown on Arrayed Nucleation Sites on amorphous or non-single crystal surfaces) within their respective first and second layers.

26. The multilayer monolithic device of claim 1, wherein at least one of the said first and second single crystal materials is respectively defined within a recessed region of, and is coplanar to a surface of a non-single crystal material that is further provided within the respective first or second layer of the at least one single crystal material.

27. A monolithic device comprising a plurality of monolithically integrated layers including at least:
 (a) a first layer; and
 (b) a second layer, disposed above the first layer and operatively coupled to the first layer for communicating with the first layer; wherein:
  (a.1) said first layer includes a respective first single crystal material defining active electronic components;
  (b.1) said second layer includes a respective second single crystal material grown from a set of spaced-apart nucleation-friendly sites whose apart spacings correspond to whole number multiples of respective lattice constants of the second single crystal material, and the spaced-apart nucleation-friendly sites thereby substantially define a growth template which seeded growth of said second single crystal material therefrom, where each nucleation-friendly site is defined by one or more particles to which the material of the second single crystal material attaches more preferentially than to surrounding material surrounding the nucleation-friendly site, the surrounding material being nucleation-unfriendly to the material of the second single crystal material.

* * * * *

UNITED STATES PATENT AND TRADEMARK OFFICE
CERTIFICATE OF CORRECTION

PATENT NO. : 6,392,253 B1
DATED : May 21, 2002
INVENTOR(S) : Arjun N. Saxena

It is certified that error appears in the above-identified patent and that said Letters Patent is hereby corrected as shown below:

<u>Title page,</u>
Item [76], Inventor "Arjun J. Saxena" should be -- Arjun N. Saxena --;

<u>Column 2,</u>
Line 59, "single crystal" should be -- <u>s</u>ingle <u>c</u>rystal --;
Line 60, "arrayed nucleation sites" should be -- <u>a</u>rrayed <u>n</u>ucleation <u>s</u>ites --.

<u>Column 8,</u>
Line 63, "single crystal" should be -- <u>s</u>ingle <u>c</u>rystal --;
Line 64, "arrayed nucleation sites" should be -- <u>a</u>rrayed <u>n</u>ucleation <u>s</u>ites --.

<u>Column 13,</u>
Line 33, "(or compound semiconductor)" should be -- (or compound semiconductor) film. [Legend #22, 22(a)] --;
Lines 36-37, delete "[Legend #8]" and "film. [Legend #22, 22(a)]".

<u>Column 14,</u>
Line 5, "SCANS-2" (first occurrence) should be -- SCANS-1 --.

<u>Column 15,</u>
Line 51, "3D-CMOSIUPIC" should be -- 3D-CMOS/UPIC --;
Line 66, "3D-CMOSIUPIC" should be -- 3D-CMOS/UPIC --;
Line 67, "4level" should be -- 4-level --.

<u>Column 17,</u>
Line 3, "claimed" should be -- claim --;
Line 66, "multilaver" should be -- multilayer --.

UNITED STATES PATENT AND TRADEMARK OFFICE
CERTIFICATE OF CORRECTION

PATENT NO. : 6,392,253 B1
DATED : May 21, 2002
INVENTOR(S) : Arjun N. Saxena

It is certified that error appears in the above-identified patent and that said Letters Patent is hereby corrected as shown below:

Column 18,
Line 20, "device a set" should be -- device as set --;
Line 23, "crystal" should be -- crystal materials --;
Line 25, "of claim 1" should be -- of claim 25 --;
Line 29, "device a set" should be -- device as set --;
Line 32, "interconnector" should be -- interconnect --;
Line 33, "device a set" should be -- device as set --.

Signed and Sealed this

Twenty-fourth Day of September, 2002

Attest:

Attesting Officer

JAMES E. ROGAN
*Director of the United States Patent and Trademark Office*